United States Patent
Ando et al.

(10) Patent No.: US 9,425,279 B1
(45) Date of Patent: Aug. 23, 2016

(54) SEMICONDUCTOR DEVICE INCLUDING HIGH-K METAL GATE HAVING REDUCED THRESHOLD VOLTAGE VARIATION

(71) Applicant: International Business Machines Corporation, Armonk, NY (US)

(72) Inventors: Takashi Ando, Tuckahoe, NY (US); David J. Frank, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/918,659

(22) Filed: Oct. 21, 2015

(51) Int. Cl.
| | |
|---|---|
| *H01L 29/00* | (2006.01) |
| *H01L 29/49* | (2006.01) |
| *H01L 21/8238* | (2006.01) |
| *H01L 21/28* | (2006.01) |
| *H01L 21/324* | (2006.01) |
| *H01L 29/423* | (2006.01) |

(52) U.S. Cl.
CPC ...... *H01L 29/4966* (2013.01); *H01L 21/28088* (2013.01); *H01L 21/324* (2013.01); *H01L 21/823828* (2013.01); *H01L 29/42372* (2013.01)

(58) Field of Classification Search
CPC ............. H01L 29/4966; H01L 29/42372; H01L 29/517; H01L 21/823828; H01L 21/28088; H01L 21/324
See application file for complete search history.

(56) References Cited

U.S. PATENT DOCUMENTS

| | | | |
|---|---|---|---|
| 7,303,996 B2 | 12/2007 | Wang et al. | |
| 7,355,235 B2 | 4/2008 | Wang et al. | |
| 8,778,759 B1 | 7/2014 | Frank et al. | |
| 8,927,409 B2 | 1/2015 | Frank | |
| 2010/0109098 A1 | 5/2010 | Lin et al. | |
| 2012/0238086 A1 | 9/2012 | Hempel et al. | |
| 2014/0017403 A1 | 1/2014 | Chu et al. | |

OTHER PUBLICATIONS

Ando et al., "Semiconductor Device Including High-K Metal Gate Having Reduced Threshold Voltage Variation", U.S. Appl. No. 14/951,792, filed Nov. 25, 2015.
List of IBM Patents or Patent Applications Treated as Related; (Appendix P), Filed Feb. 8, 2016; 2 pages.
Akasaka et al., "Modified oxygen vacancy induced fermi level pinning model extendable to P-metal pinning," Japanese Journal of Applied Physics, vol. 45, No. 12L, 2006, pp. L1289-L1292.

(Continued)

*Primary Examiner* — Nikolay Yushin
(74) *Attorney, Agent, or Firm* — Cantor Colburn LLP; Vazken Alexanian

(57) ABSTRACT

A semiconductor device having a reduced variation in threshold voltage includes a semiconductor substrate with a high dielectric-constant (high-k) layer deposited in a gate trench and on a semiconductor portion of the substrate. At least one workfunction layer has an arrangement of first and second workfunction granular portions on an upper surface of the high-k layer to define a workfunction of the semiconductor device. The arrangement of first and second workfunction granular portions define a granularity of the at least one workfunction layer. A gate contact material fills the gate trench, wherein the high-k layer has a concentration of oxygen vacancies based on the granularity of the at least one work function metal layer so as to reduce the variation in the threshold voltage.

4 Claims, 11 Drawing Sheets

(56) References Cited

OTHER PUBLICATIONS

Cho et al., "Segregation of oxygen vacancy at metal-HfO2 interfaces," Applied Physics Letters, vol. 92, No. 23, 2008, 233118, 3 pages.

Trivedi et al., "A Simulation Study of Oxygen Vacancy-Induced Variability in HfO2/Metal Gated SOI FinFET," IEEE Transactions on Electron Devices, vol. 61, No. 5, 2014, pp. 1262-1269.

Wang et al., "Statistical variability and reliability in nanoscale FinFETs," IEEE International Electron Devices Meeting (IEDM), 2011, 5.4, 4 pages.

SEMICONDUCTOR DEVICE INCLUDING HIGH-K METAL GATE HAVING REDUCED THRESHOLD VOLTAGE VARIATION

BACKGROUND

The present invention relates to semiconductor devices, and more particularly, to complementary metal-oxide-semiconductor (CMOS) devices including high-k metal gate structures.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

As the scaling of CMOS devices continues to decrease, variability in threshold voltage (Vt) of the device becomes more prevalent. For instance, CMOS devices typically implement high-k metal gate structures that include one or more work function metal layers. The work function metal layers have a natural granularity typically referred to as metal grain granularity (MGG). The orientation of the each grain, however, affects the work function of the metal layers thereby causing variations in the overall Vt of the device. In addition, the high-k material forming the gate dielectric layer can include a distribution of positively charged oxygen vacancies which contribute to random variations in the Vt of the device.

SUMMARY

According to a non-limiting embodiment, a method of fabricating a semiconductor device comprises forming at least one gate trench in a semiconductor substrate. The gate trench exposes a semiconductor portion of the substrate. The method includes forming a high dielectric-constant (high-k) layer in the at least one gate trench and on the semiconductor portion. The method further includes forming at least one workfunction layer having an arrangement of first and second workfunction granular portions on an upper surface of the high-k layer to define a workfunction of the semiconductor device. The arrangement of first and second workfunction granular portions define a granularity of the at least one workfunction layer. The method further includes performing a thermal anneal process so as to control a concentration of oxygen vacancies in the high-k layer based on the granularity of the at least one work function metal layer thereby reducing a variation in the threshold voltage.

According to another non-limiting embodiment, a method of forming a semiconductor device having reduced variations in threshold voltage comprises forming first and second gate trenches in a semiconductor substrate. The first and second gate trenches expose first and second portions of the semiconductor substrate, respectively. The method further includes forming a first high dielectric-constant (high-k) layer in the first gate trench and on the first semiconductor portion, and forming a second high-k layer in the second gate trench and on the second semiconductor portion. The method further includes depositing a first number of workfunction layers atop the first high-k layer in the first gate trench and a different second number of workfunction layers atop the second high-k layer in the second gate trench. The first number of workfunction layers defines a first threshold voltage and the second number of workfunction layers defines a second threshold voltage. Each of the work function layers has workfunction granular portions that define a respective granularity. The method further comprises performing a thermal anneal process that controls a concentration of oxygen vacancies in the high-k layer based on the granularity of the at least one work function metal layer so as to reduce variations in the first and second threshold voltages.

According to still another non-limiting embodiment, a semiconductor device having a reduced variation in threshold voltage includes a semiconductor substrate with a high dielectric-constant (high-k) layer deposited in a gate trench and on a semiconductor portion of the substrate. At least one workfunction layer has an arrangement of first and second workfunction granular portions on an upper surface of the high-k layer to define a workfunction of the semiconductor device. The arrangement of first and second workfunction granular portions define a granularity of the at least one workfunction layer. A gate contact material fills the gate trench, wherein the high-k layer has a concentration of oxygen vacancies based on the granularity of the at least one work function metal layer so as to reduce the variation in the threshold voltage.

Additional features are realized through the techniques of the present invention. Other embodiments are described in detail herein and are considered a part of the claimed invention. For a better understanding of the invention with the features, refer to the description and to the drawings.

DETAILED DESCRIPTION

Figure 1:
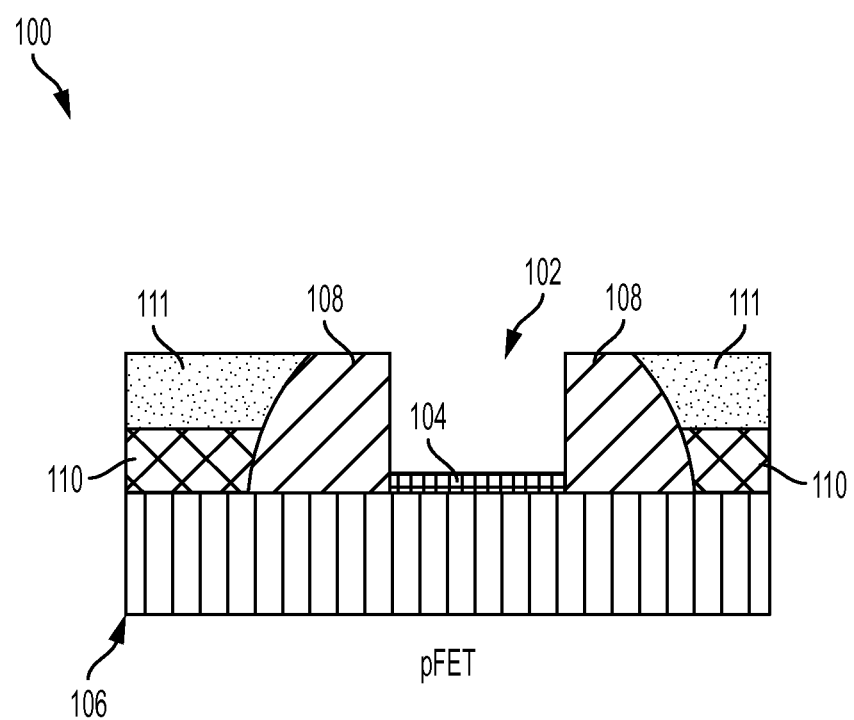
FIG. 1 illustrates an intermediate semiconductor device following removal of a dummy gate stack to form a gate trench in an active semiconductor layer of a semiconductor substrate according to a non-limiting embodiment of the invention.

The continued desire to reduce the scaling of field effect transistors have led to trends to decrease the thickness of the gate dielectric layer in high-k metal stack devices. Thin high-k dielectrics, such as those based on hafnium or zirconium for example, can be used to reduce gate leakage current compared to SiON gate dielectrics with comparable gate stack capacitance. However, depositing a high-k dielectric material on a silicon-based channel can result in a threshold voltage (Vt) that is higher than desired for certain applications. For instance, a p-channel FET (pFET) having a hafnium- or zirconium-based high-k gate dielectric on a silicon-based channel can have a Vt that is 0.5 volts (V)--0.6 V higher than desired.

A factor contributing to this higher Vt is the formation of oxygen vacancies (Vo) in a high-k dielectric in the presence of a gate electrode with a sufficiently high workfunction, particularly during dopant activation anneal. As an example, the volume density of Vo in $HfO_2$ or HfSiON, for example, is small (although not zero) because the required energy input for Vo formation in the $HfO_2$ or HfSiON in contact with an ultra-high vacuum environment is large. However, when $HfO_2$ or HfSiON is near a silicon channel and a gate electrode with a sufficiently high workfunction, two processes reduce (and may even make negative) the required energy input for Vo formation. The first is oxygen transfer from the $HfO_2$ or HfSiON to the Si substrate, oxidizing the substrate. This can occur even when a $SiO_2$ interfacial layer is present between the $HfO_2$ or HfSiON layer and the Si substrate. The second is subsequent electron transfer from the $HfO_2$ or HfSiON to the gate electrode. As a consequence of these processes, more oxygen vacancies are formed in the $HfO_2$ or HfSiON than would otherwise exist. These oxygen vacancies can be dual-positively charged so that the dielectric has a net positive charge, thereby shifting device characteristics. Consequently, the threshold voltage (Vt) and the flatband voltage (Vfb) can be shifted towards more negative values.

Various embodiments of the invention provide a semiconductor device including a high-k metal gate having a reduced threshold voltage variation. Unlike conventional semiconductor devices, which are susceptible to threshold voltage variations caused by the metal grain granularity (MGG) of the workfunction metal layers and random distribution of positively charged oxygen vacancies within the workfunction metal layer, at least one embodiment provides a semiconductor device having a controlled distribution of oxygen vacancies within the metal gate layers that essentially cancels or negates the threshold voltage variation typically caused by the MGG of the workfunction metal layers. As a result, the semiconductor device according to various non-limiting embodiments of the invention has reduced threshold voltage variations compared to conventional semiconductor devices implementing high-k metal gate stacks.

With reference now to FIG. 1, an intermediate semiconductor device 100 is illustrated following removal of a dummy gate stack (not shown). In the present specification and claims, an "intermediate" semiconductor may be viewed as a semiconductor device in a stage of fabrication prior to a final stage. The removal of the dummy gate stack creates a gate trench 102 that exposes an interfacial layer 104 disposed on an upper surface of an active semiconductor layer 106. According to a non-limiting embodiment, the active semiconductor layer 106 constitutes a portion of a bulk semiconductor substrate. It should be appreciated, however, that the active semiconductor layer 106 may be disposed atop a buried insulator layer (not shown) to form a semiconductor-on-insulator (SOI) substrate as understood by one of ordinary skill in the art. The active semiconductor layer 106 may be formed from various semiconductor materials including, but not limited to, silicon (Si).

The semiconductor device 100 further includes a pair of opposing gate spacers 108 formed atop the active semiconductor layer 106. The gate spacers 108 may be formed from various dielectric materials including, but not limited to, silicon nitride (SiN). The interfacial layer 104 is formed atop a portion of the active semiconductor layer 106 located between the spacers 108, and serves to improve the interface between the upper surface of the actively semiconductor layer 106 and a gate insulation layers (discussed in greater detail below) typically formed from a high dielectric (i.e., high-k) material. The interfacial layer 104 is formed from various materials including, but not limited to, an ozonated oxide material, a thermal oxide material, a chemical oxide material, or an ultraviolet ozone (UVO) oxidized. For example, the interfacial layer 104 is formed of $SiO_2$. The thickness (i.e., vertical height) of the interfacial layer 104 can range, for example, from approximately 0.5 nm to approximately 1.5 nm for logic devices and from approximately 2.0 nm to approximately 3.0 nm for low leakage devices, such as I/O devices.

As further illustrated in FIG. 1, the semiconductor device 100 includes raised source/drain regions 110 and an interlayer dielectric (ILD) material 111. The raised source/drain regions 110 are formed on an upper surface of the active semiconductor layer 106. According to a non-limiting embodiment, the raised source/drain regions 110 can be formed by performing an epitaxy process to grow a semiconductor material such as Si, for example, from an upper surface of the active semiconductor layer 106. The epitaxially grown semiconductor material may be in-situ doped with various dopants including, but not limited to, boron or arsenic, to increase the conductivity of the raised source/drain regions 110.

The ILD material 111 is formed on an upper surface of the active semiconductor layer 106. According to a non-limiting embodiment, the ILD material comprises silicon dioxide ($SiO_2$), for example, and may be formed according to various deposition techniques including, but not limited to, chemical vapor deposition (CVD).

Figure 2:
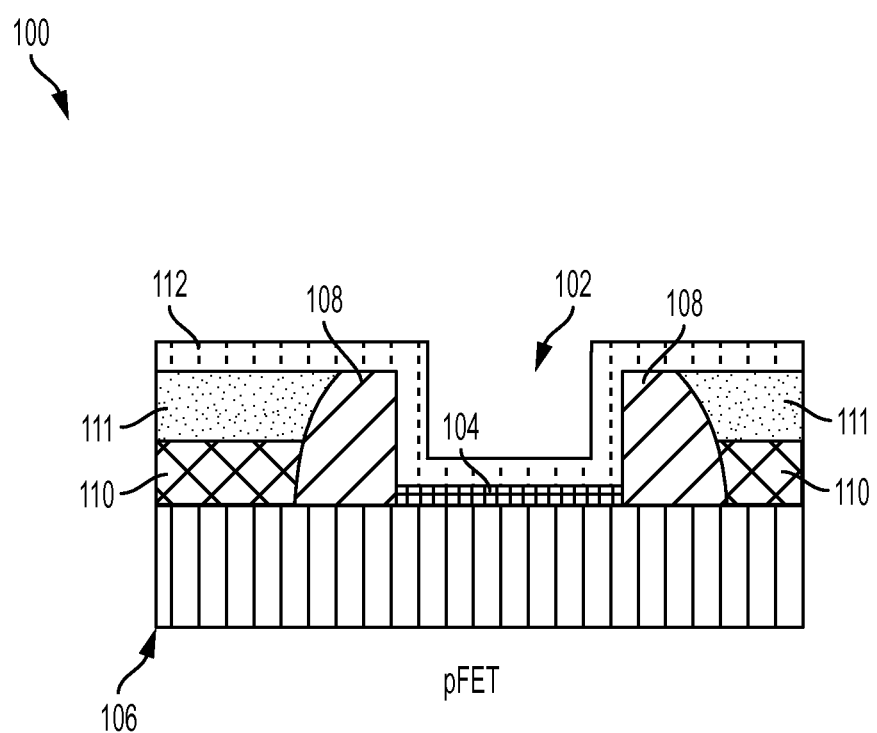
FIG. 2 illustrates the semiconductor device of FIG. 1 following deposition of a high-k layer on an upper surface of the active semiconductor layer, sidewalls of the gate trench, and on an upper surface of a gate dielectric layer exposed by the gate trench.

Turning now to FIG. 2, a high-k layer 112 is formed on the substrate 101, and conforms to the side walls of the gate trench 102 and the upper surface of the interfacial layer 104. According to a non-limiting embodiment, the high-k layer 112 is formed of various high-k materials including, but not limited to, hafnium dioxide ($HfO_2$), hafnium silicon dioxide ($HfSiO_4$), zirconium oxide ($ZrO_2$), and zirconium silicon dioxide ($ZrSiO_4$). The high-k layer 112 is deposited using various deposition techniques such as, for example, an atomic layer deposition (ALD) process, or chemical vapor deposition (CVD).

Figure 3:
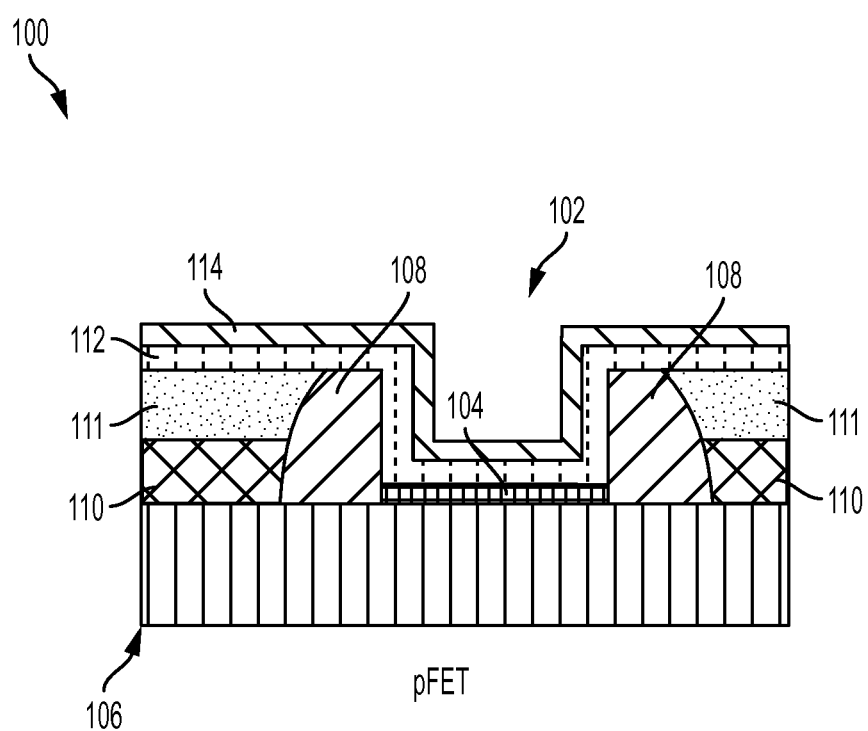
FIG. 3 illustrates the semiconductor device of FIG. 2 following deposition of an intermediate workfunction metal layer on an upper surface of the high-k layer.

Referring to FIG. 3, a first layer 114 is formed on an upper surface of the high-k layer 112. The first layer 114 may be deposited using various techniques including, but not limited to, ALD or CVD, and may be formed from various materials including, but not limited to, an aluminum-free metal nitride layer. For example, the first layer 114 may include an aluminum-free metal nitride material selected from a group comprising titanium nitride (TiN) and tantalum nitride (TaN). The thickness of the first layer 114 can be adjusted to define a work function characteristic of the device 100. According to a non-limiting embodiment, the first layer 114 has a thickness ranging from approximately 10 angstroms (Å) to approximately 30 Å.

Figure 4A:
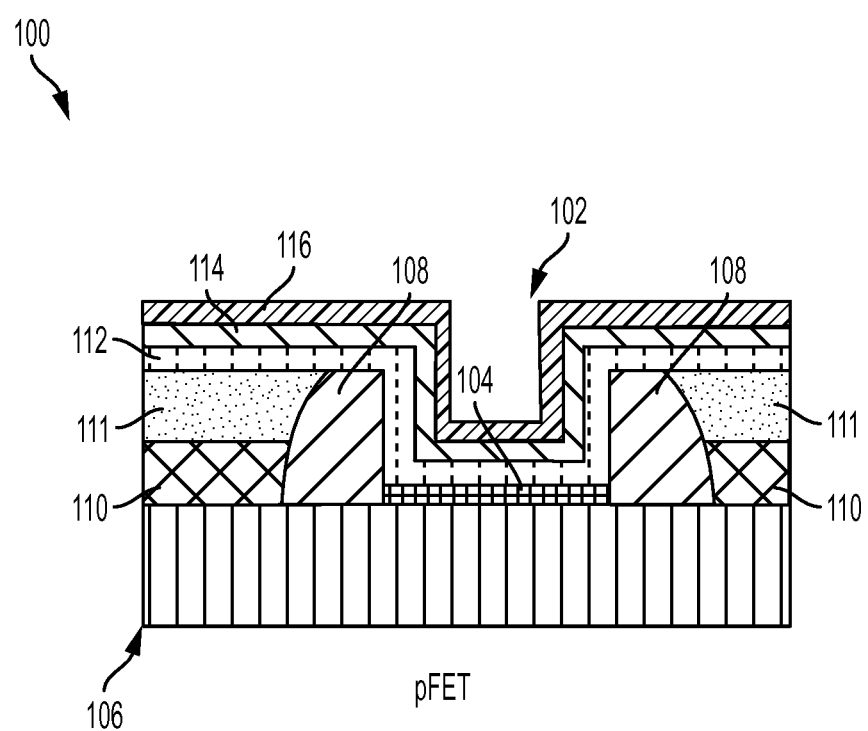
FIG. 4A illustrates the semiconductor device of FIG. 3 following deposition of an upper workfunction metal layer on an upper surface of the intermediate workfunction metal layer.

Turning now to FIG. 4A, the semiconductor device of FIG. 3 is illustrated following deposition of an upper workfunction metal layer 116 on an upper surface of the intermediate workfunction metal layer 114. In this manner, a p-type semiconductor device (i.e., a pFET) may be formed. The second layer 116 may be deposited using an ALD process, for example, and includes various metal ceramic materials. For example, the second layer 116 may be an aluminum-containing metal material selected from the group comprising titanium-aluminum (TiAl), titanium-aluminum-nitrogen (TiAlN), and titanium-aluminum-carbon (TiAlC). According to a non-limiting embodiment, the second layer 116 may be formed by applying layers of Al and one or more additional metals in sequential atomic layers in an ALD process. In an embodiment in which the second layer 116 comprises TiAl, layers of Ti and Al may be deposited in sequence in predetermined ratios.

In the embodiment in which the second layer 116 includes TiAl, the ratio of Al:(Al+Ti) may be adjusted to adjust a work function of the device 100. The thickness of the second layer 116 can range, for example, from approximately 10 Å to approximately 60 Å. According to a non-limiting embodiment, a ratio of Al:(Al+Ti) is substantially constant throughout the entire second layer 116. In other words, layers of Al and Ti are deposited by an ALD process in constant ratios. According to a non-limiting embodiment, the percentage of Al relative to Al+Ti in the second layer 116 ranges, for example, from approximately 10% to approximately 90%.

According to another embodiment, the second layer 116 is formed by depositing layers of titanium nitride (TiN) and titanium aluminum nitride (TiAlN) in a particular sequence to obtain a layer of TiAlN. In this manner, the second layer 116 can be formed with ratio of Al:Ti, or a predetermined gradient of ratios of Al:Ti.

Figure 4B:
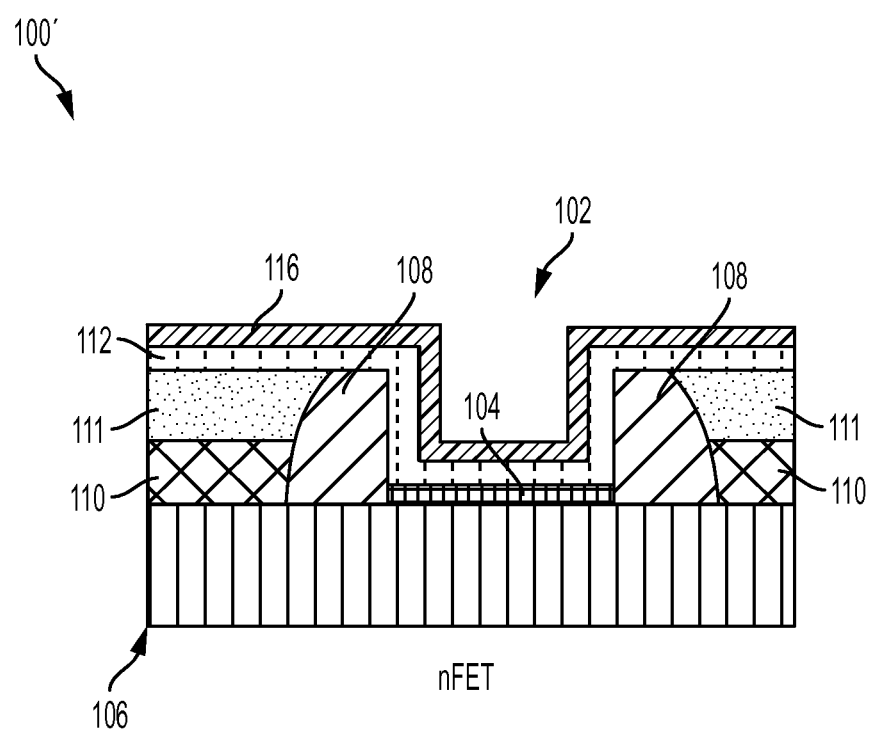
FIG. 4B illustrates the semiconductor device of FIG. 3 following deposition of an upper workfunction metal layer directly on an upper surface of the high-k layer according to another non-limiting embodiment.

With reference to FIG. 4B, the semiconductor device of FIG. 3 is illustrated following deposition of an upper workfunction metal layer 116 atop the high-k layer 112 according to another non-limiting embodiment. Unlike the embodiment of FIG. 4A, the device 100 excludes the intermediate workfunction metal layer 114. In this manner, the upper workfunction metal layer 116 is formed directly on an upper surface of the high-k layer 112 so as to form an n-type semiconductor device 100' (i.e., nFET). The upper workfunction metal layer 116 can be deposited using the various aforementioned deposition processes to achieve the same upper workfunction metal layer characteristics and properties discussed above.

Although the nFET device 100' illustrated in FIG. 4B is shown separate and isolated from the pFET device illustrated in FIG. 4A, it should be appreciated that the nFET device 100' and pFET device can be located on a common substrate. For instance, a conformal intermediate workfunction metal layer 114 can be deposited atop the high-k layer 112 included with both the pFET device 100 and the nFET device 100'. Thereafter, a mask layer (not shown) can be deposited atop the intermediate workfunction metal layer 114 and subsequently patterned. Patterning the mask layer allows for exposing a portion of the intermediate workfunction metal layer 114 included with the nFET device 100' while the remaining portion of the intermediate workfunction metal layer 114 included with the pFET device 100 remains covered. The exposed intermediate workfunction metal layer 114 can then be selectively etched (i.e., removed), and the upper workfunction metal layer 116 can be deposited directly on an upper surface of the high-k layer 112 to form the nFET device 100' shown in FIG. 4B. After forming the nFET device 100', the mask layer can be removed from the pFET device and the process flow can be continued as discussed further below.

In addition it should be appreciated that when forming the pFET device 100 and the nFET device 100' together on a common substrate, different combination of masking techniques may be implemented in order to achieve the combination of workfunction metal layers 114-116 for each device 100-100'. The workfunction metal layers 114-116 may define the threshold voltage (Vt) for a particular semiconductor device. For example, instead of depositing a single conformal intermediate workfunction layer 114 on the upper surface of the high-k layer 112 included with both the pFET device and nFET device, a first masking layer (not shown) can be deposited on the upper surface of the high-k layer 112 included with both the pFET device 100 and nFET device 100'. The first masking layer can then be patterned to expose the high-k layer 112 of the pFET device 100 and the upper workfunction metal layer 116 can then be deposited on the upper surface of the first masking layer and the upper surface of the exposed high-k layer 112. Thereafter, a second masking layer (not shown) can be deposited and patterned so as to expose the upper workfunction metal layer 116 of the nFET device 100', while covering the upper workfunction metal layer 116 included with the pFET device 100. An etching process selective to the material of the upper workfunction metal layer 116 is subsequently performed so as to re-expose the first masking layer included with the nFET device 100'. Finally, the first and second masking layers are selectively removed so as to provide the pFET device 100 shown in FIG. 4A and the nFET device 100' shown in FIG. 4B.

Figure 5:
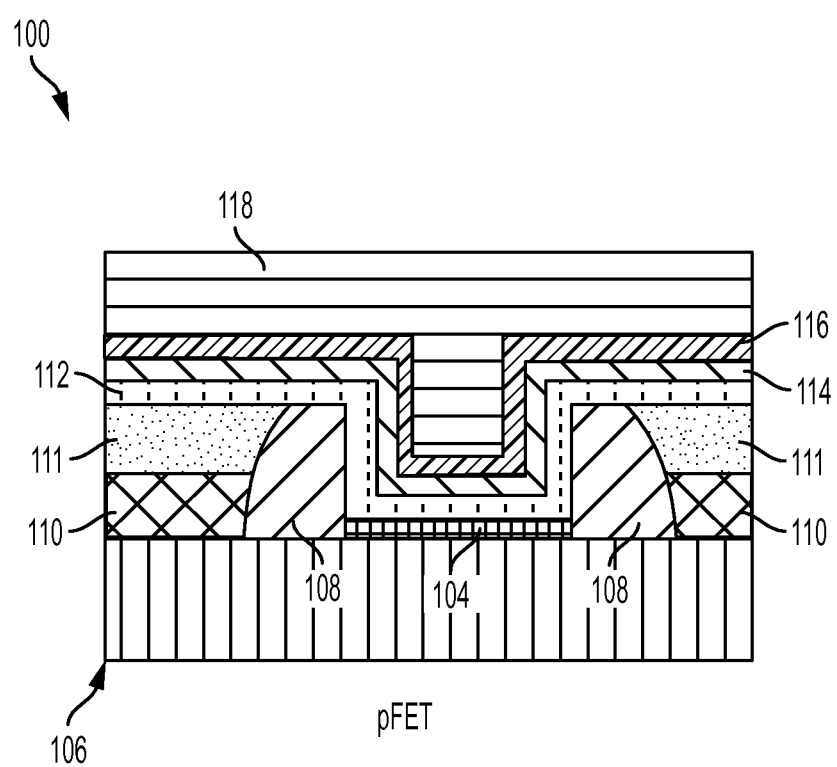
FIG. 5 illustrates the semiconductor device of FIG. 4A following deposition of a bulk contact layer on an upper surface of the upper workfunction layer so as to fill the gate trench.

Referring now to FIG. 5, the semiconductor device of FIG. 4A is illustrated after forming a bulk contact layer 118 atop the upper workfunction metal layer 116. The bulk contact layer 118 is deposited on an upper surface of the upper workfunction layer 116 so as to completely fill the gate trench (previously indicated as element 102). In this manner, the upper workfunction metal layer 116 is interposed between the bulk contact layer 118 and the intermediate workfunction metal layer 114.

Figure 6A:
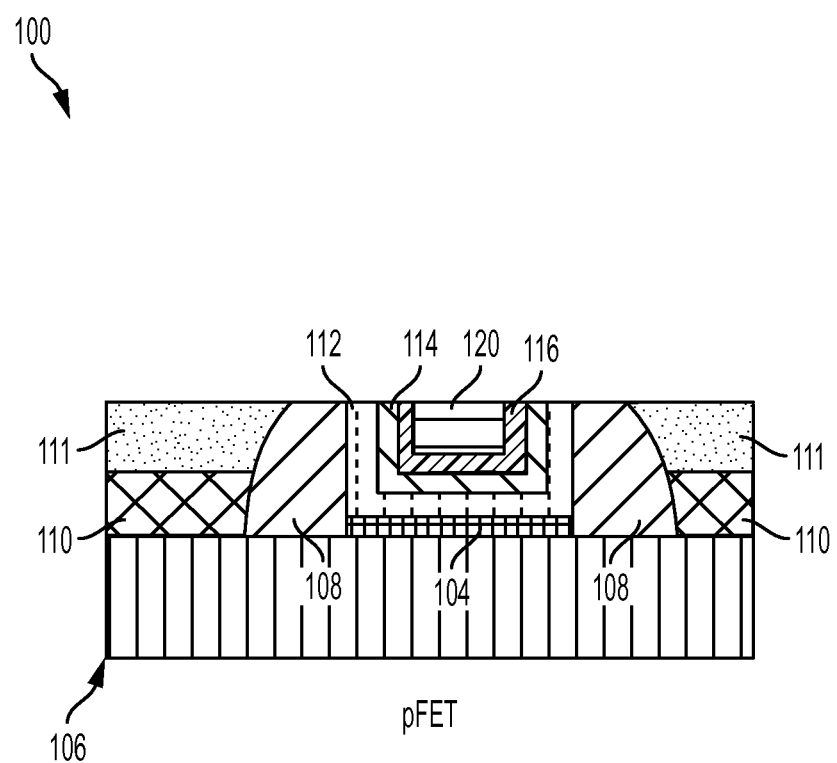
FIG. 6A illustrates the semiconductor device of FIG. 5 after planarizing the bulk contact layer to form a gate contact.

The bulk contact layer 118 may be formed of any conductive metal including, but not limited to, aluminum and tungsten. The bulk contact layer 118 may be formed in a conforming process, such as ALD, or a non-conforming process, such as PVD. Subsequently, a planarization process is applied to the pFET device 100. The planarization process includes a chemical-mechanical planarization (CMP) process, for example, which stops on the upper surface of the upper workfunction metal layer 116 as illustrated in FIG. 6A. Accordingly, the upper workfunction metal layer 116 is interposed between the gate contact 120 and the intermediate workfunction metal layer 114.

Figure 6B:
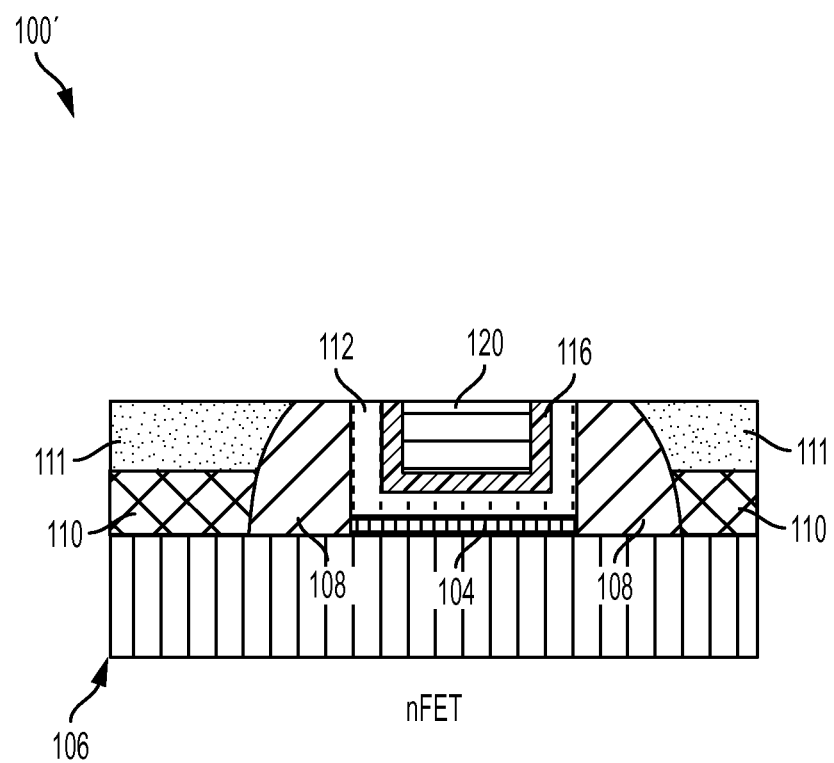
FIG. 6B illustrates the semiconductor device of the second embodiment shown in FIG. 4B to from a gate contact.

In this manner, a gate contact 120 is formed in the gate trench and is flush with the upper surface of the workfunction metal layer 116 as further illustrated in FIG. 6A. In a similar manner, a CMP process can be applied to the nFET device 100' as illustrated in FIG. 6B. Unlike the pFET device 100, however, the upper workfunction metal layer 116 is interposed between the gate contact 120 and the high-k layer 112.

Figure 7:
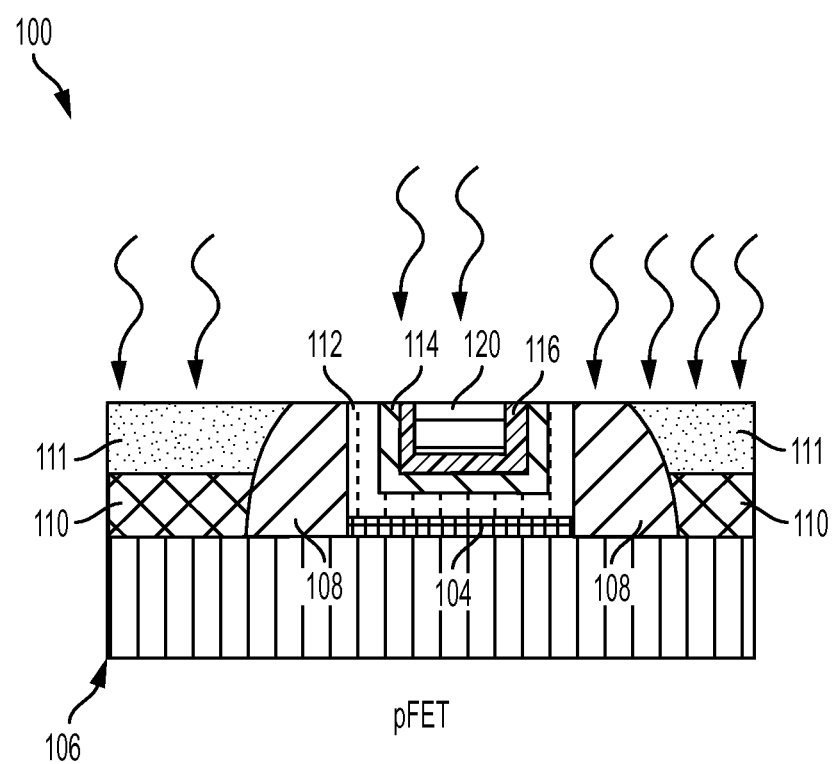
FIG. 7 illustrates the semiconductor device of FIG. 6A undergoing a thermal anneal process.

Turning now to FIG. 7, the pFET device 100 is illustrated undergoing a thermal anneal process. The thermal anneal process includes exposing the pFET device 100 to low temperatures of less than or equal to 450 C in the presence of a reducing ambient, e.g., hydrogen (H$_2$) for approximately 30 min. In response to the thermal anneal process, metal workfunction oxygen vacancies (Vo) are created in the high-k layer 112. Unlike conventional high-k metal gate semiconductor device, however, non-uniform groupings of oxygen vacancies (not shown in FIG. 7) are created in the high-k layer 112 based on the local metal work function variability. That is, a controlled formation of higher amount of oxygen vacancies are created beneath the higher work function portion of the metal electrode so as to cancel out variations in threshold voltages typically caused by the natural granularity, i.e., the metal grain granularity (MGG), of the intermediate workfunction layer 114 and/or the upper workfunction layer 116.

Figure 8:
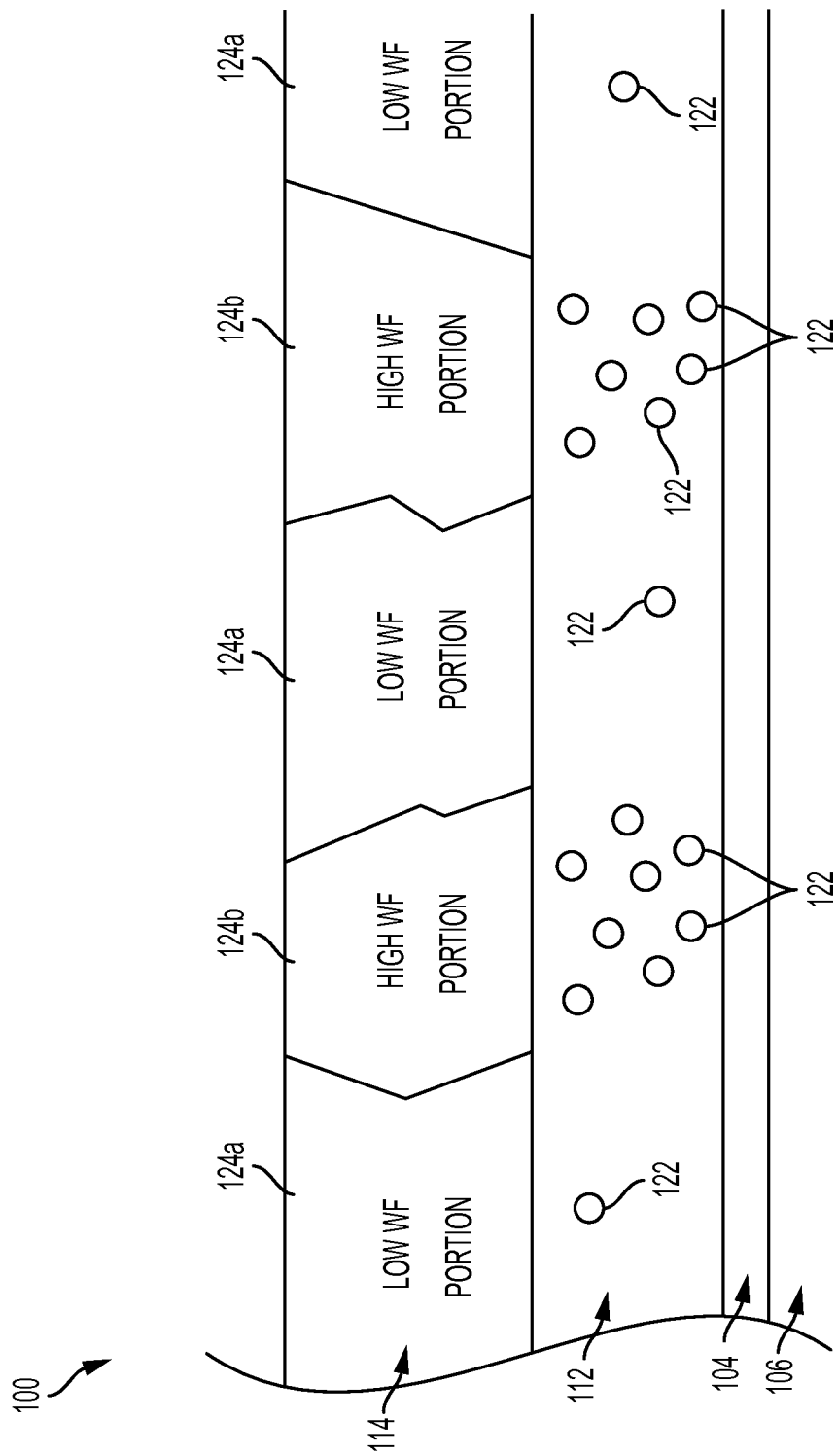
FIG. 8 illustrates the controlled formation of oxygen vacancies in the high-k layer following the thermal anneal process of FIG. 7 according to a non-limiting embodiment.

Turning to FIG. 8, for example, a controlled formation of oxygen vacancies 122 in the high-k layer 112 following the thermal anneal process of FIG. 7 is illustrated according to a non-limiting embodiment. A close-up view of the pFET device 100 is illustrated, which shows the MGG of the intermediate workfunction layer 114. For example, the MGG of the intermediate workfunction layer 114 includes a random arrangement of low workfunction grain portions 124a and high workfunction grain portion 124b. The low workfunction grain portions 124a may be defined as grains with crystal orientation showing lower workfunction or grains including higher amount of Al if it is an Al-containing alloy, whereas the high workfunction grain portions 124b may be defined as grains with crystal orientation showing higher workfunction or grains including lower amount of Al if it is an Al-containing alloy. Due to the Fermi level pinning effect, a greater majority of positively charged oxygen vacancies 122 are concentrated beneath the high workfunction grain portions 124b compared to the low workfunction grain portions 124a in response to the low heat applied according the thermal anneal process. By concentrating the majority of oxygen vacancies 122 beneath the high workfunction grain portions 124b, threshold voltage variations typically caused by the MGG of the workfunction metal layer 114 are substantially reduced or even eliminated. Accordingly, a high-k metal gate semiconductor device implementing workfunction metal layers is provided having reduced variations in Vt compared to conventional semiconductor devices.

Figure 9:
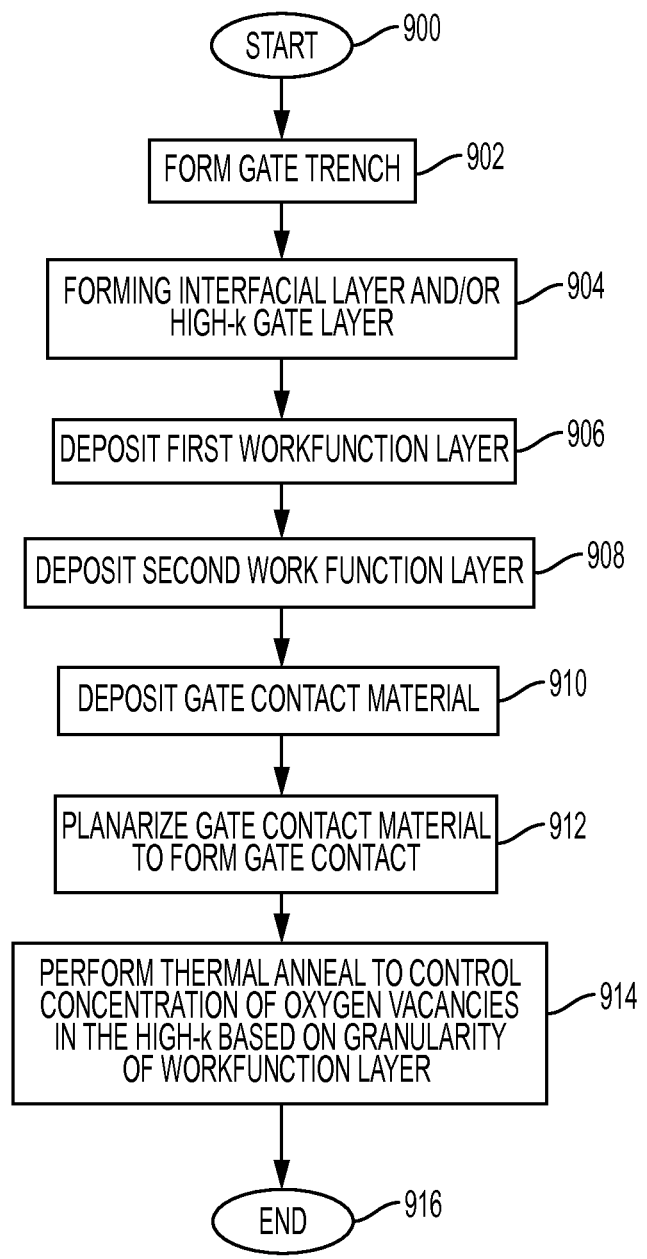
FIG. 9 is a flow diagram illustrating a method of fabricating a semiconductor device having a reduced variation in threshold voltage according to a non-limiting embodiment.

Turning now to FIG. 9, a flow diagram illustrates a method of fabricating a semiconductor device having a reduced variation in threshold voltage according to a non-limiting embodiment. The method begins at operation 900, and at operation 902 one or more gate trenches are formed in a semiconductor. In this manner, a portion (e.g., a channel portion) of the semiconductor substrate is exposed. According to a non-limiting embodiment, the gate trench can be formed according to a replacement metal gate (RMG) process. For instance, a dummy gate stack previously constructed atop the semiconductor substrate can be removed thereby forming a corresponding gate trench in the substrate. At operation 904, a conformal high-k gate layer is formed on an upper surface of the semiconductor substrate. The high-k layer conforms to the sidewalls of the gate trench and the upper surface of the exposed channel portion. The high-k layer is formed of various high-k gate dielectric materials including, but not limited to, HfO$_2$. According to a non-limiting embodiment, an interfacial layer may also be deposited at operation 904 prior to depositing the high-k gate layer. The interfacial layer may be formed of SiO$_2$, for example, and serves to improve the interface between the upper surface of the channel portion and the subsequently formed high-k layer.

Turning to operation 906, a first workfunction layer is deposited on an upper surface of the high-k layer. The first work function layer includes an aluminum-free metal nitride layer comprising an aluminum-free metal nitride material selected from the group comprising titanium nitride (TiN) and tantalum nitride (TaN). At operation 908, a second workfunction layer is deposited on an upper surface of the first workfunction layer. The second work function layer comprises an aluminum-containing metal material selected from the group comprising titanium-aluminum (TiAl), titanium-aluminum-nitrogen (TiAlN), and titanium-aluminum-carbon (TiAlC). At operation 910, a gate contact material is deposited on an upper surface of the second work function layer so as to fill the gate trench. The gate contact material includes, for example, Al or W. At operation 912, a planarization process such as a CMP process, for example, is performed which stops on an upper surface of the underlying workfunction layer. In this manner, a gate contact is formed having an upper surface that is flush with the workfunction metal layer. At operation 914, a thermal anneal process is performed so as to control the formation of oxygen vacancies in the high-k layer based on the granularity of one or more of the workfunction layers, and the method ends at operation 916. According to a non-limiting embodiment, the workfunction layer formed on the high-k layer includes an arrangement of high workfunction granular portions and low workfunction granular portions, and the thermal anneal process controls the distribution of oxygen vacancies such that a first concentration of the oxygen vacancies is formed in the high-k layer beneath the low workfunction granular portion and a greater second concentration of the oxygen vacancies are formed in the high-k layer beneath the high workfunction granular portion. In this manner, the higher concentration of oxygen vacancies cancels out the threshold voltage variation caused by the high workfunction granular portions of the workfunction layer. With respect to the process flow described above, it should be appreciated that the thermal anneal process may be performed at any stage following deposition of the aluminum-containing workfunction layer. In addition, various standard back-end-of-line processes, for example, may be performed after the method ends at operation 916.

Although the flow diagram described above illustrates a process of forming a pFET device, it should be appreciated that an nFET device may be formed in a similar manner. For instance, the nFET device may be formed by omitting operation 906 which deposits the aluminum-free metal nitride layer atop the high-k layer. In this manner, a nFET device may be formed including an aluminum-containing workfunction layer deposited directly on an upper surface of the high-k layer. In addition, it should be appreciated that the pFET device and nFET device may be formed on the same semiconductor substrate. In this case, the process flow includes one or more workfunction masking and patterning processes such that the pFET device includes the aluminum-free workfunction layer formed directly on the high-k layer, while nFET device includes the aluminum-containing workfunction layer formed directly on the high-k layer as described in detail above.

As described in detail above, various embodiments of the invention provide a semiconductor device including a high-k metal gate having a reduced threshold voltage variation. Unlike conventional semiconductor devices, at least one embodiment provides a semiconductor device having a controlled distribution of oxygen vacancies within the metal gate layers that essentially cancels or negates the threshold voltage variation typically caused by the MGG of the workfunction metal layers. In this manner, the semiconductor device according to various non-limiting of the invention has reduced threshold voltage variations compared to conventional semiconductor devices implementing high-k metal gate stacks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device having a reduced variation in threshold voltage, comprising:
    a semiconductor substrate including a high dielectric-constant (high-k) layer in at least one gate trench and atop a semiconductor portion of the substrate;
    at least one workfunction layer having an arrangement of first and second workfunction granular portions on an upper surface of the high-k layer to define a workfunction of the semiconductor device, the arrangement of first and second workfunction granular portions defining a granularity of the at least one workfunction layer; and
    a gate contact material that fills the gate trench,
    wherein the high-k layer has a concentration of oxygen vacancies based on the granularity of the at least one work function metal layer thereby reducing the variation in the threshold voltage.

2. The semiconductor device of claim 1, wherein the granularity is defined by an arrangement of high workfunction granular portions and low workfunction granular portion in the at least one workfunction layer.

3. The semiconductor device of claim 2, wherein a first concentration of the oxygen vacancies is formed in the high-k layer beneath the low workfunction granular portion and a second concentration of the oxygen vacancies are formed in the high-k layer beneath the high workfunction granular portion, the second concertation being greater than the first concentration.

4. The semiconductor device of claim 1, wherein the at least one workfunction layer includes an aluminum-free metal nitride layer comprising an aluminum-free metal nitride material selected from the group comprising titanium nitride (TiN) and tantalum nitride (TaN), and wherein the gate contact material is selected from a group comprising aluminum (Al) and tungsten (W).

* * * * *